US012738937B2

(12) United States Patent
Shimmyo et al.

(10) Patent No.: US 12,738,937 B2
(45) Date of Patent: Sep. 15, 2026

(54) SIGNAL PROCESSING DEVICE AND CONTROL METHOD

(71) Applicant: Nuvoton Technology Corporation Japan, Kyoto (JP)

(72) Inventors: Akinori Shimmyo, Hyogo (JP); Kenji Tanaka, Osaka (JP); Kazuya Hatooka, Hyogo (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 11 days.

(21) Appl. No.: 18/999,623

(22) Filed: Dec. 23, 2024

(65) Prior Publication Data

US 2025/0132760 A1 Apr. 24, 2025

Related U.S. Application Data

(63) Continuation of application No. PCT/JP2023/023780, filed on Jun. 27, 2023.

(30) Foreign Application Priority Data

Jun. 29, 2022 (JP) ................................ 2022-104533

(51) Int. Cl.
*H03K 17/687* (2006.01)

(52) U.S. Cl.
CPC ................................ *H03K 17/6871* (2013.01)

(58) Field of Classification Search
CPC ...... H03K 17/6871; H04B 3/04; H04B 15/04; H04L 25/03885
See application file for complete search history.

(56) References Cited

U.S. PATENT DOCUMENTS 9,806,915 B1 10/2017 Elzeftawi et al.
2002/0141598 A1* 10/2002 Vayrynen ............ G10L 21/0208 381/94.5
2013/0315290 A1* 11/2013 Farjad-Rad ....... H04L 25/03159 375/232
2020/0106439 A1 4/2020 Funabashi et al.

FOREIGN PATENT DOCUMENTS

JP 6837549 B2 3/2021

OTHER PUBLICATIONS

International Search Report dated Sep. 19, 2023 issued in International Patent Application No. PCT/JP2023/023780, with English translation.

* cited by examiner

*Primary Examiner* — Metasebia T Retebo
(74) *Attorney, Agent, or Firm* — Rimon P.C.

(57) ABSTRACT

A re-timer (a signal processing device) includes: a receiver that receives a signal; a transmitter that transmits the signal received by the receiver; and a controller. The receiver includes an equalizer circuit that compensates attenuation of the signal received. The transmitter includes a noise cancelling circuit that reduces noise included in a processed signal generated in the receiver. The controller: detects a threshold voltage of a transistor included in the re-timer; when the threshold voltage detected is lower than or equal to a predetermined voltage value, sets a current of the equalizer circuit to be lower than or equal to a predetermined current value and deactivates the noise cancelling circuit; and when the threshold voltage detected is higher than the predetermined voltage value, sets the current of the equalizer circuit to be higher than the predetermined current value and activates the noise cancelling circuit.

8 Claims, 5 Drawing Sheets

FIG. 6

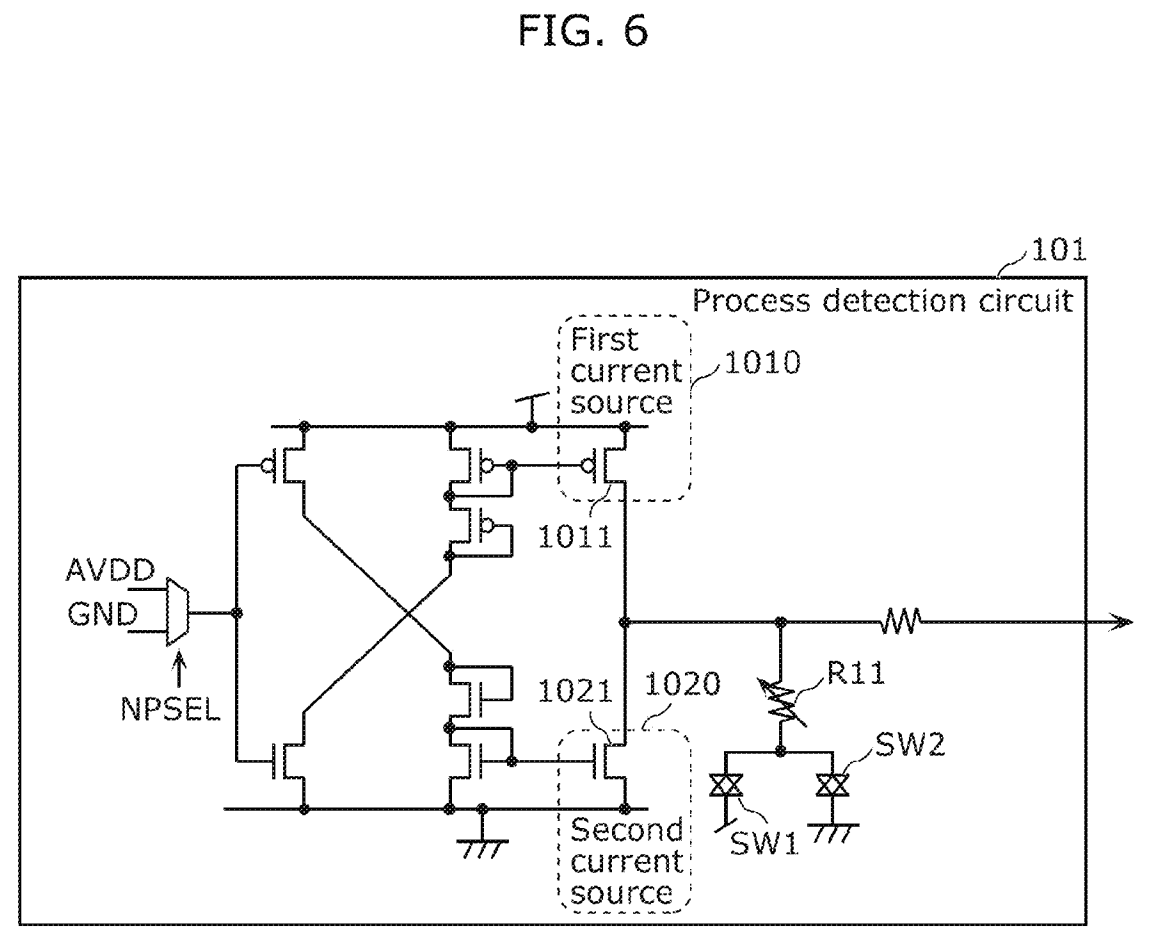

101
Process detection circuit
1010
First current source
1011
1020
Second current source
1021
R11
SW1
SW2
AVDD
GND
NPSEL

SIGNAL PROCESSING DEVICE AND CONTROL METHOD

CROSS REFERENCE TO RELATED APPLICATIONS

This is a continuation application of PCT International Application No. PCT/JP2023/023780 filed on Jun. 27, 2023, designating the United States of America, which is based on and claims priority of Japanese Patent Application No. 2022-104533 filed on Jun. 29, 2022. The entire disclosures of the above-identified applications, including the specifications, drawings and claims are incorporated herein by reference in their entirety.

FIELD

The present disclosure relates to a signal processing device that performs signal processing on a received signal and transmits the processed signal, and a method of controlling the signal processing device.

BACKGROUND

PTL 1 discloses that a noise cancelling circuit including: a first parallel-serial conversion circuit and a first driver; and a second parallel-serial conversion circuit and a second driver respectively same as the first parallel-serial conversion circuit and the first driver is used to reduce the power supply noise caused by a data pattern.

PTL 2 discloses that an equalizer circuit is used to restore the attenuated waveform.

CITATION LIST

Patent Literature

PTL 1: Japanese Patent No. 6837549
PTL 2: U.S. Pat. No. 9,806,915

SUMMARY

Technical Problem

When a signal processing device such as a re-timer is included in a cable, a low-power operation is required to prevent the signal processing device from heating and firing. However, the technique disclosed in PTL 1 uses the same circuits, and thus the power consumption increases accordingly. Moreover, the technique disclosed in PTL 2, a constant current is consumed to restore the attenuated waveform.

In view of the above, the present disclosure provides a signal processing device or the like that can reduce the power consumption.

Solution to Problem

A signal processing device according to the present disclosure is a signal processing device including: a receiver that receives a signal; a transmitter that transmits the signal received by the receiver; and a controller. The receiver includes an equalizer circuit that compensates attenuation of the signal received. The transmitter includes a noise cancelling circuit that reduces noise included in a processed signal generated in the receiver. The controller: detects a threshold voltage of a transistor included in the signal processing device; when the threshold voltage detected is lower than or equal to a predetermined voltage value, sets a current of the equalizer circuit to be lower than or equal to a predetermined current value and deactivates the noise cancelling circuit; and when the threshold voltage detected is higher than the predetermined voltage value, sets the current of the equalizer circuit to be higher than the predetermined current value and activates the noise cancelling circuit.

A control method according to the present disclosure is a method of controlling a signal processing device that includes: a receiver that receives a signal; and a transmitter that transmits the signal received by the receiver. The receiver includes an equalizer circuit that compensates attenuation of the signal received. The transmitter includes a noise cancelling circuit that reduces noise included in a processed signal generated in the receiver. The method includes: determining whether a threshold voltage of a transistor included in the signal processing device is lower than or equal to a predetermined voltage value; when the threshold voltage of the transistor included in the signal processing device is determined to be lower than or equal to a predetermined voltage value, setting a current of the equalizer circuit to be lower than or equal to a predetermined current value and deactivating the noise cancelling circuit; and when the threshold voltage of the transistor included in the signal processing device is determined to be higher than the predetermined voltage value, setting the current of the equalizer circuit to be higher than the predetermined current value and activating the noise cancelling circuit.

It should be noted that these generic or specific aspects may be implemented as a system, a method, an integrated circuit, a computer program, a computer-readable recording medium such as a CD-ROM, or any combination thereof.

Advantageous Effects

According to the signal processing device or the like according to one aspect of the present disclosure, it is possible to reduce the power consumption.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 6 is a circuit diagram illustrating one example of a process detection circuit according to the embodiment.

DESCRIPTION OF EMBODIMENT

Figure 1:
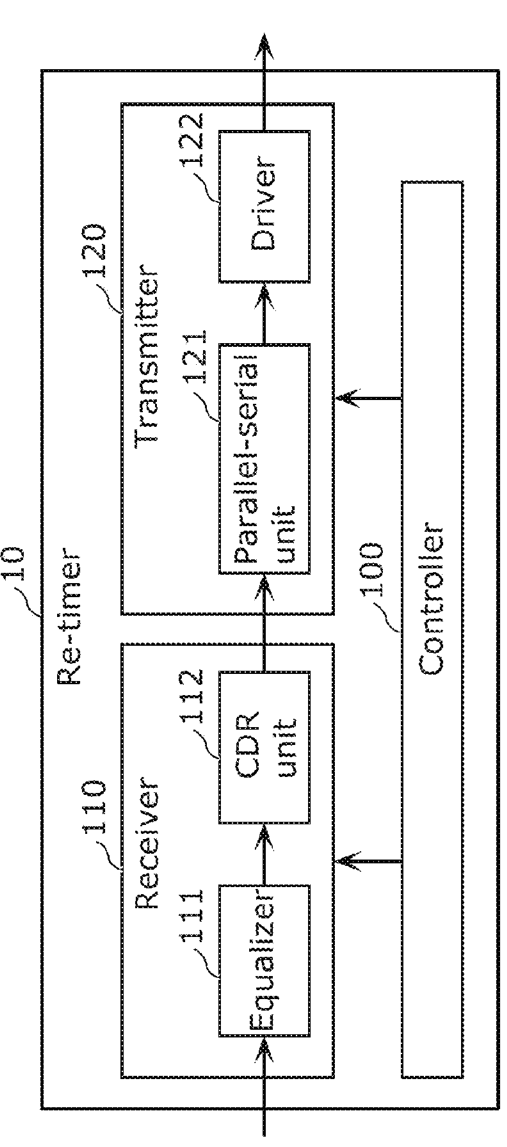
FIG. 1 is a configuration diagram illustrating one example of a re-timer according to an embodiment.

A signal processing device according to one aspect of the present disclosure is a signal processing device including: a receiver that receives a signal; a transmitter that transmits the signal received by the receiver; and a controller. The receiver includes an equalizer circuit that compensates attenuation of the signal received. The transmitter includes a noise cancelling circuit that reduces noise included in a processed signal generated in the receiver. The controller: detects a threshold voltage of a transistor included in the signal processing device; when the threshold voltage detected is lower than or equal to a predetermined voltage value, sets a current of the equalizer circuit to be lower than or equal to a predetermined current value and deactivates the noise cancelling circuit; and when the threshold voltage detected is higher than the predetermined voltage value, sets the current of the equalizer circuit to be higher than the predetermined current value and activates the noise cancelling circuit.

When the threshold voltage of the transistor included in the signal processing device is lower than or equal to the predetermined voltage value (i.e., the threshold voltage of the transistor is low), the power consumption of the signal processing device increases. Meanwhile, in this case, the gain of the equalizer circuit increases. Moreover, the delay sensitivity is lowered and the jitter decreases. For this reason, in exchange for the increased gain of the equalizer circuit, the current of the equalizer circuit is set to be lower than or equal to the predetermined current value, thereby reducing the current consumption of the equalizer circuit. Moreover, the delay sensitivity is lowered and the jitter decreases, and thus it is not necessary to activate the noise cancelling circuit. Thus, the noise cancelling circuit may be deactivated. Accordingly, it is possible to reduce the power consumption by setting the current of the equalizer circuit to be lower than or equal to the predetermined current value and deactivating the noise cancelling circuit when the threshold voltage of the transistor included in the signal processing device is lower than or equal to the predetermined voltage value.

For example, the controller may include: a detection circuit that detects the threshold voltage of the transistor included in the signal processing device; a determination circuit that determines whether the threshold voltage detected is lower than or equal to the predetermined voltage value; and a control circuit that controls the equalizer circuit and the noise cancelling circuit based on a determination result of the determination circuit.

As described above, the controller may be constituted by the detection circuit, the determination circuit, and the control circuit.

For example, the controller may include: a detection circuit that detects the threshold voltage of the transistor included in the signal processing device; and a memory circuit. Whether the threshold voltage detected is lower than or equal to the predetermined voltage value may be determined by an external tester outside the signal processing device, and the external tester may write, into the memory circuit, data indicating a determination result of the external tester. For example, the controller may control the equalizer circuit and the noise cancelling circuit based on the data written into the memory circuit.

As described above, a constituent element for determining whether the threshold voltage of the transistor is lower than or equal to the predetermined voltage value is implemented as a high-accuracy external tester provided outside the signal processing device, and thus it is possible to reduce variation in determination and further reduce variation in control of the equalizer circuit and the noise cancelling circuit.

For example, the detection circuit may include: a resistor that is switchable to a pull-up resistor or a pull-down resistor; a first current source that is connected between the resistor and a power source and includes a p-channel MOSFET; and a second current source that is connected between the resistor and a ground and includes an n-channel MOSFET. The detection circuit may: detect, as the threshold voltage of the transistor included in the signal processing device, a threshold voltage of the p-channel MOSFET and a threshold voltage of the n-channel MOSFET; detect the threshold voltage of the p-channel MOSFET by turning on the first current source and turning off the second current source to switch the resistor to the pull-down resistor; and detect the threshold voltage of the n-channel MOSFET by turning off the first current source and turning on the second current source to switch the resistor to the pull-up resistor.

Such a circuit configuration allows detecting the threshold voltages of the p-channel MOSFET and the n-channel MOSFET.

For example, the resistor may be a variable resistor.

This allows improving the detection accuracy for the threshold voltages of the p-channel MOSFET and the n-channel MOSFET.

For example, the predetermined voltage value may be a value corresponding to a jitter tolerance determined according to a standard.

With this, it is possible to reduce the power consumption while securing a good property such that the jitter is lower than or equal to the tolerance.

A control method according to one aspect of the present disclosure is a method of controlling a signal processing device that includes: a receiver that receives a signal; and a transmitter that transmits the signal received by the receiver. The receiver includes an equalizer circuit that compensates attenuation of the signal received. The transmitter includes a noise cancelling circuit that reduces noise included in a processed signal generated in the receiver. The method includes: determining whether a threshold voltage of a transistor included in the signal processing device is lower than or equal to a predetermined voltage value; when the threshold voltage of the transistor included in the signal processing device is determined to be lower than or equal to a predetermined voltage value, setting a current of the equalizer circuit to be lower than or equal to a predetermined current value and deactivating the noise cancelling circuit; and when the threshold voltage of the transistor included in the signal processing device is determined to be higher than the predetermined voltage value, setting the current of the equalizer circuit to be higher than the predetermined current value and activating the noise cancelling circuit.

In this manner, it is possible to provide a control method that can reduce the power consumption of the signal processing device.

Hereinafter, an embodiment is described in detail with reference to the drawings.

It is to be noted that the embodiment described below shows a general or specific example. The numerical values, shapes, materials, structural elements, the arrangement and connection of the structural elements, steps, the order of steps, etc., illustrated in the following embodiment are mere examples, and therefore do not limit the present disclosure.

Embodiment

The following describes a signal processing device according to an embodiment. It is to be noted that, as one example of the signal processing device, a re-timer is taken and described below. It is to be noted that the signal processing device may be a re-driver, a repeater, or the like.

FIG. 1 is a configuration diagram illustrating one example of re-timer 10 according to an embodiment.

In high-speed signal transmission, the waveform is deformed by attenuation of the signal amplitude or influence of noise. However, the jitter is compensated by re-timer 10, and thus the high-speed signal transmission is possible while keeping the waveform.

Re-timer 10 includes controller 100, receiver 110, and transmitter 120.

Receiver 110 includes equalizer 111 and CDR unit 112. Receiver 110 receives a signal, and equalizer 111 and CDR unit 112 perform signal processing on the received signal.

Equalizer 111 compensates attenuation of the received signal, and is, for example, a continuous time linear equalizer (CTLE). The waveform of the attenuated signal can be restored by equalizer 111.

Equalizer 111 has an equalizer circuit that compensates the attenuation of the received signal. The equalizer circuit is described later with reference to FIG. 2.

CDR unit 112 has a clock data recovery (CDR) function, and reforms the waveform of the signal.

Transmitter 120 includes parallel-serial unit 121 and driver 122. Transmitter 120 transmits the signal received by receiver 110, and parallel-serial unit 121 and driver 122 perform signal processing on the signal transmitted by transmitter 120.

Parallel-serial unit 121 converts a parallel signal from receiver 110 into a serial signal.

Driver 122 receives the serial signal and outputs the received serial signal.

Parallel-serial unit 121 and driver 122 have a noise cancelling circuit that reduces noise included in the processed signal generated in receiver 110. The noise cancelling circuit is described later with reference to FIG. 3.

Controller 100 detects the threshold voltage of the transistor included in re-timer 10, and controls receiver 110 and transmitter 120 (specifically, the equalizer circuit and the noise cancelling circuit) according to the detected threshold voltage. Although controller 100 is described in detail later, when the detected threshold voltage is lower than or equal to a predetermined voltage value, controller 100 sets the current of the equalizer circuit to be lower than or equal to a predetermined current value and deactivates the noise cancelling circuit. When the detected threshold voltage is higher than the predetermined voltage value, controller 100 sets the current of the equalizer circuit to be higher than the predetermined current value and activates the noise cancelling circuit.

Here, the equalizer circuit and the noise cancelling circuit are described with reference to FIG. 2 and FIG. 3.

Figure 2:
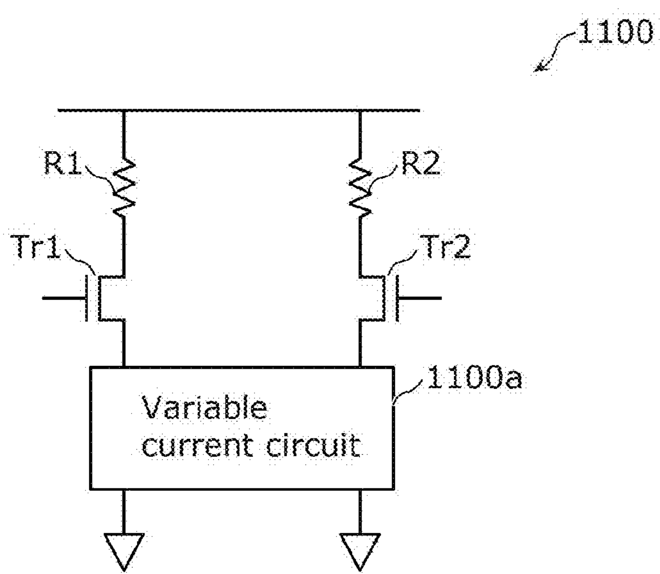
FIG. 2 is a configuration diagram illustrating one example of an equalizer circuit according to the embodiment.

FIG. 2 is a configuration diagram illustrating one example of equalizer circuit 1100 according to the embodiment.

Equalizer circuit 1100 includes, for example, resistors R1 and R2, transistors Tr1 and Tr2, and variable current circuit 1100*a*. For example, variable current circuit 1100*a* can change the current of equalizer circuit 1100 (specifically, the current flowing through resistor R1 and transistor Tr1 and the current flowing through resistor R2 and transistor Tr2) by being controlled by controller 100.

Figure 3:
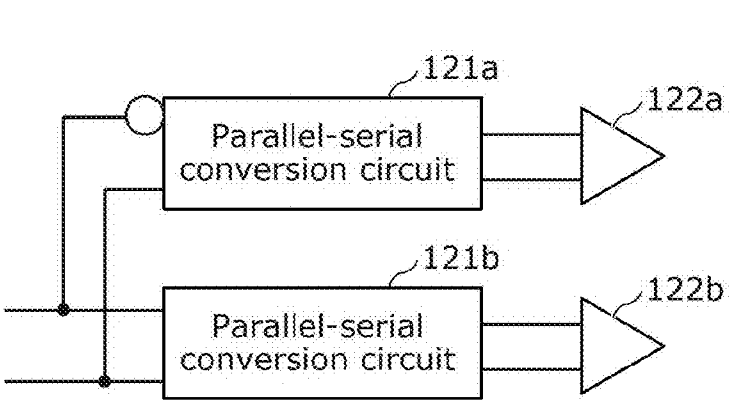
FIG. 3 is a configuration diagram illustrating one example of a noise cancelling circuit according to the embodiment.

FIG. 3 is a configuration diagram illustrating one example of noise cancelling circuit 1200 according to the embodiment.

Noise cancelling circuit 1200 includes parallel-serial conversion circuits 121*a* and 121*b* and buffers 122*a* and 122*b*.

Parallel-serial conversion circuit 121*a* converts a received parallel signal into a serial signal, and parallel-serial conversion circuit 121*b* also converts a received parallel signal into a serial signal. Parallel-serial conversion circuits 121*a* and 121*b* are constituted by substantially the same circuit. Here, "constituted by substantially the same circuit" means having a circuit configuration through which substantially the same consumption current flows at the same timing. Typically, parallel-serial conversion circuits 121*a* and 121*b* are connected to the same power source and the same ground, and constituted by the same circuit.

Buffer 122*a* receives the serial signal after conversion in parallel-serial conversion circuit 121*a*, and buffer 122*b* receives the serial signal after conversion in parallel-serial conversion circuit 121*b*. Buffer 122*a* and buffer 122*b* are constituted by substantially the same circuit.

As described in PTL 1, for parallel-serial conversion circuit 121*a*, parallel-serial conversion circuit 121*b* is provided which is constituted by substantially the same circuit as parallel-serial conversion circuit 121*a*, and for buffer 122*a*, buffer 122*b* is provided which is constituted by substantially the same circuit as buffer 122*a*. With this, noise can be reduced.

For example, noise cancelling circuit 1200 can be controlled by controller 100 to deactivate noise cancelling circuit 1200. Specifically, noise cancelling circuit 1200 can be controlled by controller 100 to activate parallel-serial conversion circuit 121*a* and buffer 122*a* and not to activate parallel-serial conversion circuit 121*b* and buffer 122*b*.

As described above, when the detected threshold voltage is lower than or equal to a predetermined voltage value, controller 100 sets the current of equalizer circuit 1100 to be lower than or equal to a predetermined current value and deactivates noise cancelling circuit 1200. When the detected threshold voltage is higher than the predetermined voltage value, controller 100 sets the current of equalizer circuit 1100 to be higher than the predetermined current value and activates noise cancelling circuit 1200.

When the threshold voltage of the transistor included in re-timer 10 is lower than or equal to the predetermined voltage value (i.e., the threshold voltage of the transistor is low), the power consumption of re-timer 10 increases. Meanwhile, in this case, the gain of equalizer circuit 1100 increases. Moreover, the delay sensitivity is lowered and the jitter decreases. For this reason, in exchange for the increased gain of equalizer circuit 1100, the current of equalizer circuit 1100 is set to be lower than or equal to a predetermined current value, thereby reducing the current consumption of equalizer circuit 1100. It is to be noted that the predetermined current value is not particularly limited, but is appropriately set according to the performance of equalizer circuit 1100. Moreover, the delay sensitivity is lowered and the jitter decreases, and thus it is not necessary to activate noise cancelling circuit 1200. Thus, noise cancelling circuit 1200 may be deactivated. Accordingly, it is possible to reduce the power consumption by setting the current of equalizer circuit 1100 to be lower than or equal to the predetermined current value and deactivating noise cancelling circuit 1200 when the threshold voltage of the transistor included in re-timer 10 is lower than or equal to the predetermined voltage value. The reduction effect on the power consumption is described with reference to FIG. 4.

Figure 4:
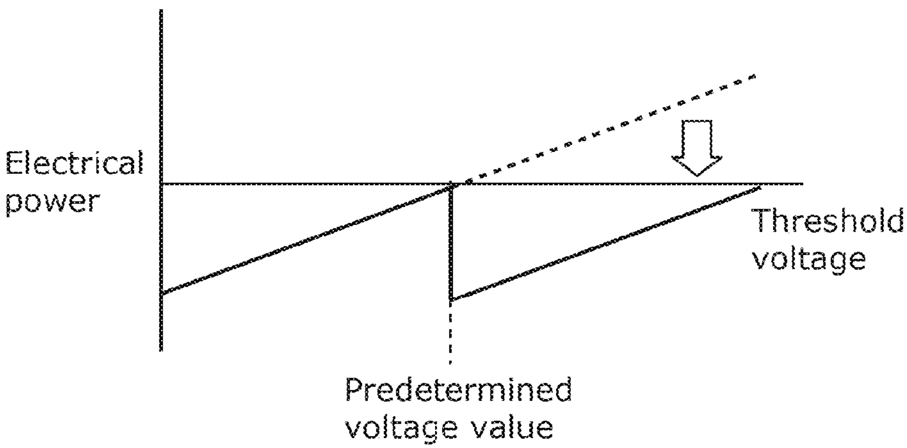
FIG. 4 is a diagram for explaining the reduction effect on power consumption.

FIG. 4 is a diagram for explaining the reduction effect on the power consumption. The horizontal axis in FIG. 4 represents the threshold value of the transistor included in re-timer 10, and also represents that the threshold voltage is low on the right side and high on the left side. The vertical axis in FIG. 4 represents the power consumption of re-timer 10, and also represents that the power consumption is high on the upper side and low on the lower side. The dashed line in FIG. 4 represents the relationship between the threshold voltage and the power consumption in the case where controller 100 does not set the current of equalizer circuit 1100 to be lower than or equal to the predetermined current value and keeps noise cancelling circuit 1200 active when the detected threshold voltage is lower than or equal to the predetermined voltage value. The solid line in FIG. 4 represents the relationship between the threshold voltage and the power consumption in the case where controller 100 sets the current of equalizer circuit 1100 to be lower than or equal to the predetermined current value and deactivates noise cancelling circuit 1200 when the detected threshold voltage is lower than or equal to the predetermined voltage value.

As can be seen from the dashed line in FIG. 4, the power consumption of re-timer 10 increases with decreasing the threshold voltage of the transistor included in re-timer 10. In contrast, as can be seen from the solid line in FIG. 4, on condition that controller 100 sets the current of equalizer circuit 1100 to be lower than or equal to the predetermined current value and deactivates noise cancelling circuit 1200 when the detected threshold voltage is lower than or equal to the predetermined voltage value, the power consumption of re-timer 10 can be reduced even when the threshold voltage of the transistor included in re-timer 10 is lower than or equal to the predetermined voltage value.

It is to be noted that examples of the predetermined voltage value include, but are not limited to, a value corresponding to a jitter tolerance determined according to the standard. By setting such a predetermined voltage value, it is possible to reduce the power consumption while securing a good property such that the jitter is lower than or equal to the tolerance.

Next, controller 100 is described in detail.

Figure 5:
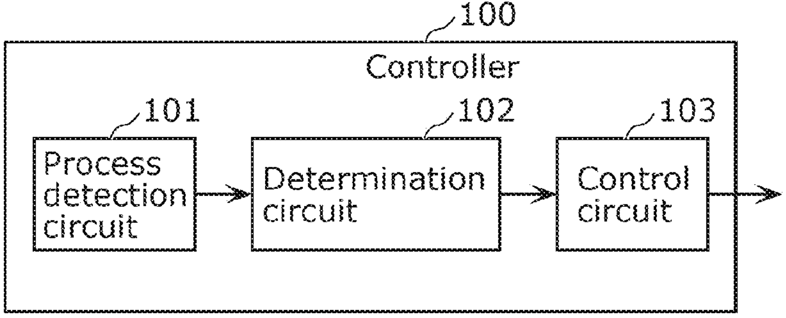
FIG. 5 is a configuration diagram illustrating one example of a controller according to the embodiment.

FIG. 5 is a configuration diagram illustrating one example of controller 100 according to the embodiment.

For example, controller 100 includes process detection circuit 101, determination circuit 102, and control circuit 103.

Process detection circuit 101 detects the threshold voltage of the transistor included in re-timer 10. Process detection circuit 101 is one example of a detection circuit. Process detection circuit 101 is described in detail later.

Determination circuit 102 determines whether the detected threshold voltage is lower than or equal to the predetermined voltage value. Determination circuit 102 is a comparator or the like, and can make the determination described above by comparing the threshold voltage detected by process detection circuit 101 and the predetermined voltage value.

Control circuit 103 controls equalizer circuit 1100 and noise cancelling circuit 1200 based on the determination result of determination circuit 102. Specifically, control circuit 103 adjusts the current of equalizer circuit 1100 and activates or deactivates noise cancelling circuit 1200 based on the determination result of determination circuit 102.

As described above, controller 100 may be constituted by process detection circuit 101, determination circuit 102, and control circuit 103.

Next, the circuit configuration of process detection circuit 101 is described with reference to FIG. 6.

FIG. 6 is a circuit diagram illustrating one example of process detection circuit 101 according to the embodiment.

Process detection circuit 101 includes resistor R11, first current source 1010, second current source 1020, and the like.

Resistor R11 is a resistor that is switchable to a pull-up resistor or a pull-down resistor. When switch SW1 is on and switch SW2 is off, resistor R11 is connected to the power source to serve as a pull-up resistor. When switch SW1 is off and switch SW2 is on, resistor R11 is connected to the ground to serve as a pull-down resistor.

First current source 1010 is connected between resistor R11 and the power source, and includes p-channel MOSFET 1011. As illustrated in FIG. 6, the source of p-channel MOSFET 1011 is connected to the power source, and the drain of p-channel MOSFET 1011 is connected to resistor R11. Regarding the circuit connected to the gate of p-channel MOSFET 1011, the detailed description is omitted, but a circuit for controlling on/off of p-channel MOSFET 1011 is connected to the gate.

Second current source 1020 is connected between resistor R11 and the ground, and includes n-channel MOSFET 1021. As illustrated in FIG. 6, the drain of n-channel MOSFET 1021 is connected to resistor R11, and the source of n-channel MOSFET 1021 is connected to the ground. Regarding the circuit connected to the gate of n-channel MOSFET 1021, the detailed description is omitted, but a circuit for controlling on/off of n-channel MOSFET 1021 is connected to the gate.

Process detection circuit 101 detects, as the threshold voltage of the transistor included in re-timer 10, the threshold voltage of p-channel MOSFET 1011 and the threshold voltage of n-channel MOSFET 1021. Transistors included in re-timer 10 are each manufactured in the same manufacturing process, and p-channel MOSFET 1011 and n-channel MOSFET 1021 included in process detection circuit 101 are manufactured in the same manufacturing process as the transistors included in receiver 110, transmitter 120, and the like. For this reason, the threshold voltages of p-channel MOSFET 1011 and n-channel MOSFET 1021 included in process detection circuit 101 are basically the same as the threshold voltages of the transistors included in re-timer 10. Accordingly, the threshold voltages of the transistors included in re-timer 10 (the p-channel MOSFET and the n-channel MOSFET) can be detected by detecting the threshold voltages of p-channel MOSFET 1011 and n-channel MOSFET 1021 in process detection circuit 101.

Process detection circuit 101 detects the threshold voltage of p-channel MOSFET 1011 by turning on first current source 1010 and turning off second current source 1020 to switch resistor R11 to the pull-down resistor. Specifically, process detection circuit 101 turns on p-channel MOSFET 1011 included in first current source 1010, turns off n-channel MOSFET 1021 included in second current source 1020, turns off switch SW1, and turns on switch SW2. With this, a voltage corresponding to the threshold voltage of p-channel MOSFET 1011 is generated at a node between first current source 1010 and second current source 1020, and process detection circuit 101 outputs the voltage generated at this node as the threshold voltage of p-channel MOSFET 1011.

For example, when the threshold voltage of p-channel MOSFET 1011 is high, the current flowing through p-channel MOSFET 1011 and resistor R11 is low, and thus the voltage at the node is also low. When the threshold voltage of p-channel MOSFET 1011 is low, the current flowing through p-channel MOSFET 1011 and resistor R11 is high, and thus the voltage at the node is also high. As described above, there is a correlation between the voltage at the node and the threshold voltage of p-channel MOSFET 1011, and thus process detection circuit 101 can detect the voltage at the node as the threshold voltage of p-channel MOSFET 1011.

Process detection circuit 101 detects the threshold voltage of n-channel MOSFET 1021 by turning off first current source 1010 and turning on second current source 1020 to switch resistor R11 to the pull-up resistor. Specifically, process detection circuit 101 turns off p-channel MOSFET 1011 included in first current source 1010, turns on n-channel MOSFET 1021 included in second current source 1020, turns on switch SW1, and turns off switch SW2. With this, a voltage corresponding to the threshold voltage of n-channel MOSFET 1021 is generated at a node between first current source 1010 and second current source 1020, and process detection circuit 101 outputs the voltage generated at this node as the threshold voltage of n-channel MOSFET 1021.

For example, when the threshold voltage of n-channel MOSFET 1021 is high, the current flowing through resistor R11 and n-channel MOSFET 1021 is low, and thus the voltage at the node is high. When the threshold voltage of n-channel MOSFET 1021 is low, the current flowing through resistor R11 and n-channel MOSFET 1021 is high, and thus the voltage at the node is low. As described above, there is a correlation between the voltage at the node and the threshold voltage of n-channel MOSFET 1021, and thus process detection circuit 101 can detect the voltage at the node as the threshold voltage of n-channel MOSFET 1021.

Such a circuit configuration allows detecting the threshold voltages of p-channel MOSFET 1011 and n-channel MOSFET 1021.

For example, resistor R11 is a variable resistor. This allows improving the detection accuracy for the threshold voltages of p-channel MOSFET 1011 and n-channel MOSFET 1021.

It is to be noted that controller 100 does not need to include determination circuit 102. This is described with reference to FIG. 7.

Figure 7:
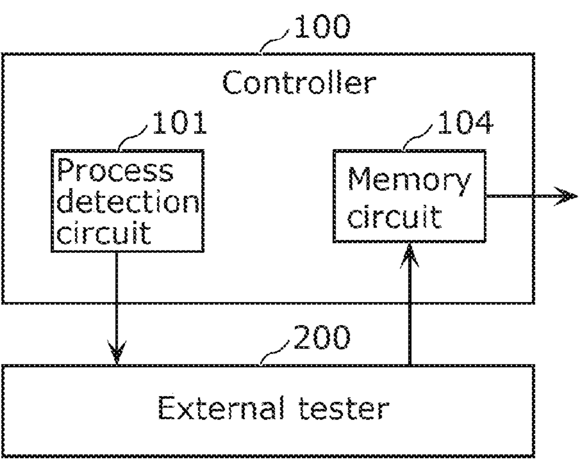
FIG. 7 is a configuration diagram illustrating another example of the controller according to the embodiment.

FIG. 7 is a configuration diagram illustrating another example of controller 100 according to the embodiment. It is to be noted that FIG. 7 also illustrates external tester 200 provided outside re-timer 10.

As illustrated in FIG. 7, controller 100 includes memory circuit 104 and process detection circuit 101 that detects the threshold voltage of the transistor included in re-timer 10, and it may be determined by external tester 200 provided outside re-timer 10 whether the threshold voltage detected by process detection circuit 101 is lower than or equal to the predetermined voltage value.

External tester 200 write, into memory circuit 104, data indicating the determination result of external tester 200. For example, for each of p-channel MOSFET 1011 and n-channel MOSFET 1021, external tester 200 determines whether the threshold voltage is lower than or equal to the predetermined voltage value, and writes data indicating the determination result into memory circuit 104.

Controller 100 controls equalizer circuit 1100 and noise cancelling circuit 1200 based on the data indicating the determination result of external tester 200 written into memory circuit 104. In other words, when the determination result indicating that the threshold voltage of the transistor is lower than or equal to the predetermined voltage value has been written into memory circuit 104, controller 100 sets the current of equalizer circuit 1100 to be lower than or equal to the predetermined current value and deactivates noise cancelling circuit 1200. Moreover, when the determination result indicating that the threshold voltage of the transistor is higher than the predetermined voltage value has been written into memory circuit 104, controller 100 sets the current of equalizer circuit 1100 to be higher than the predetermined current value and activates noise cancelling circuit 1200.

As described above, a constituent element for determining whether the threshold voltage of the transistor is lower than or equal to the predetermined voltage value is implemented as high-accuracy external tester 200 provided outside re-timer 10, and thus it is possible to reduce variation in determination and further reduce variation in control of equalizer circuit 1100 and noise cancelling circuit 1200.

It is to be noted that receiver 110 may have a function of adjusting the current of equalizer circuit 1100 according to the determination result indicating whether the threshold voltage of the transistor is lower than or equal to the predetermined voltage value. In this case, controller 100 may just output, to receiver 110, the determination result written into memory circuit 104. In other words, controller 100 does not need to directly control equalizer circuit 1100, and may indirectly control equalizer circuit 1100 by informing receiver 110 of the determination result.

Moreover, transmitter 120 may have a function of activating or deactivating noise cancelling circuit 1200 according to the determination result indicating whether the threshold voltage of the transistor is lower than or equal to the predetermined voltage value. In this case, controller 100 may just output, to transmitter 120, the determination result written into memory circuit 104. In other words, controller 100 does not need to directly control noise cancelling circuit 1200, and may indirectly control noise cancelling circuit 1200 by informing transmitter 120 of the determination result.

For example, external tester 200 may compare the threshold voltage and multiple voltage values. For example, external tester 200 may determine whether the threshold voltage of the transistor is lower than or equal to the first voltage, whether to be higher than the first voltage and lower than or equal to the second voltage, whether to be higher than the second voltage, or the like. This allows more fine control of equalizer circuit 1100 and noise cancelling circuit 1200 according to the threshold voltage of the transistor. In particular, this allows fine adjustment of the current of equalizer circuit 1100.

As described above, when the threshold voltage of the transistor included in re-timer 10 is lower than or equal to the predetermined voltage value (i.e., the threshold voltage of the transistor is low), the power consumption of re-timer 10 increases. Meanwhile, in this case, the gain of equalizer circuit 1100 increases. Moreover, the delay sensitivity is lowered and the jitter decreases. For this reason, in exchange for the increased gain of equalizer circuit 1100, the current of equalizer circuit 1100 is set to be lower than or equal to a predetermined current value, thereby reducing the current consumption of equalizer circuit 1100. Moreover, the delay sensitivity is lowered and the jitter decreases, and thus it is not necessary to activate noise cancelling circuit 1200. Thus, noise cancelling circuit 1200 may be deactivated. Accordingly, it is possible to reduce the power consumption by setting the current of equalizer circuit 1100 to be lower than or equal to the predetermined current value and deactivating noise cancelling circuit 1200 when the threshold voltage of the transistor included in re-timer 10 is lower than or equal to the predetermined voltage value.

Other Embodiments

The signal processing device (re-timer 10) according to one or more aspects of the present disclosure is described above based on the embodiment, but the present disclosure is not limited to the embodiment. The scope of one or more aspects of the present disclosure may encompass embodiments obtainable by adding, to each embodiment, various kinds of modifications that a person skilled in the art would conceive and embodiments configurable by combining constituent elements in different embodiments, without deviating from the scope of the present disclosure.

For example, the foregoing embodiment describes the case in which resistor R11 is a variable resistor, but resistor R11 is not limited to a variable resistor.

For example, the present disclosure can be implemented not only as the signal processing device but also as a method of controlling the signal processing device, including steps (processes) performed by the constituent elements included in the signal processing device.

Figure 8:
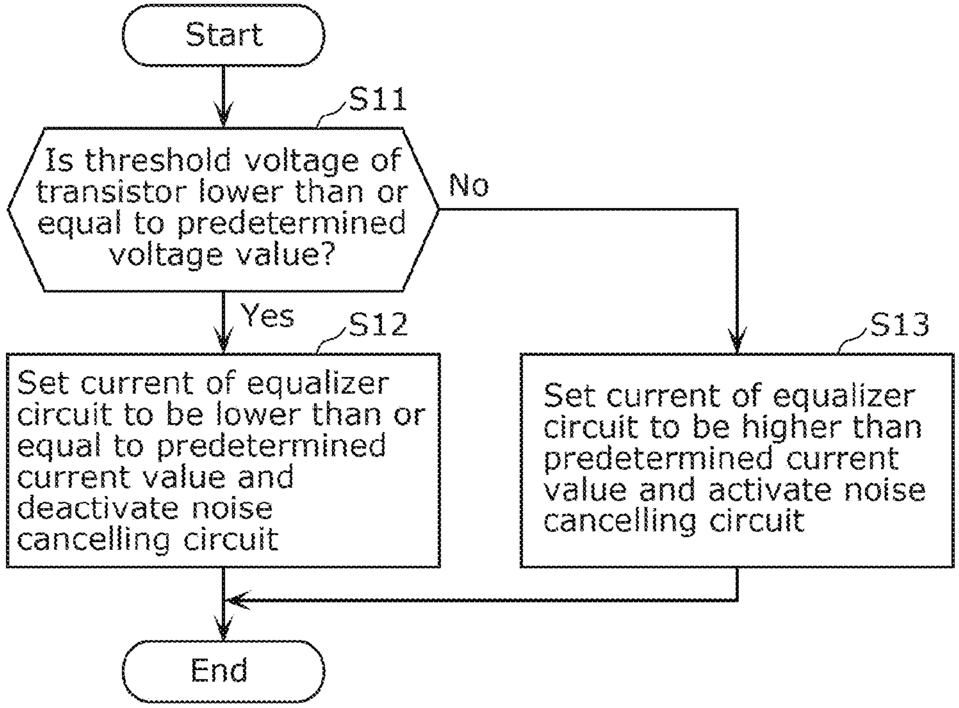
FIG. 8 is a flowchart illustrating one example of a control method according to another embodiment.

FIG. 8 is a flowchart illustrating one example of the control method according to another embodiment.

The control method is a method of controlling a signal processing device that includes: a receiver that receives a signal; and a transmitter that transmits the signal received by the receiver. The receiver includes an equalizer circuit that compensates attenuation of the signal received. The transmitter includes a noise cancelling circuit that reduces noise included in a processed signal generated in the receiver. As illustrated in FIG. 8, the method includes: determining whether a threshold voltage of a transistor included in the signal processing device is lower than or equal to a predetermined voltage value (Step S11); when the threshold voltage of the transistor included in the signal processing device is determined to be lower than or equal to a predetermined voltage value (Yes in Step S11), setting a current of the equalizer circuit to be lower than or equal to a predetermined current value and deactivating the noise cancelling circuit (Step S12); and when the threshold voltage of the transistor included in the signal processing device is determined to be higher than the predetermined voltage value (No in Step S11), setting the current of the equalizer circuit to be higher than the predetermined current value and activating the noise cancelling circuit (Step S13).

For example, the present disclosure can be implemented as a program for causing a processor to execute the steps included in the control method. Furthermore, the present disclosure can be implemented as a non-transitory computer-readable recording medium, such as a CD-ROM, recording the program.

For example, when the present disclosure is implemented by a program (software), each step is performed by using hardware resources of a computer such as a CPU, a memory, and an input-output circuit to execute the program. In other words, each step is performed by the CPU obtaining data from the memory, the input-output circuit, or the like and performing calculates, or outputting the calculation results to the memory, the input-output circuit, or the like.

It is to be noted that, in the foregoing embodiment, each constituent element in the signal processing device may be configured in the form of an exclusive hardware product, or may be realized by executing a software program suitable for each constituent element. Each constituent element may be realized by means of a program executing unit, such as a CPU and a processor, reading and executing the software program recorded on a recording medium such as a hard disk or a semiconductor memory.

Part or all of the functionality of the signal processing device according to the foregoing embodiment is typically implemented as a large-scale integration (LSI) circuit, which is an integrated circuit. These may be integrated into separate chips, or some or all of them may be integrated into a single chip. The integration may be achieved, not only as a LSI, but also as a dedicated circuit or a general purpose processor. Also applicable is a field programmable gate array (FPGA), which allows post-manufacture programming, or a reconfigurable processor LSI, which allows reconfiguration of connection and setting of circuit cells therein.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a re-timer included in a cable.

The invention claimed is:

1. A signal processing device comprising:
- a receiver that receives a signal;
- a transmitter that transmits the signal received by the receiver; and
- a controller, wherein
- the receiver includes an equalizer circuit that compensates attenuation of the signal received,
- the transmitter includes a noise cancelling circuit that reduces noise included in a processed signal generated in the receiver,
- the controller:
  - detects a threshold voltage of a transistor included in the signal processing device;
  - when the threshold voltage detected is lower than or equal to a predetermined voltage value, sets a current of the equalizer circuit to be lower than or equal to a predetermined current value and deactivates the noise cancelling circuit; and
  - when the threshold voltage detected is higher than the predetermined voltage value, sets the current of the equalizer circuit to be higher than the predetermined current value and activates the noise cancelling circuit, and
- the controller includes:
- a detection circuit that detects the threshold voltage of the transistor included in the signal processing device;
- a determination circuit that determines whether the threshold voltage detected is lower than or equal to the predetermined voltage value; and
- a control circuit that controls the equalizer circuit and the noise cancelling circuit based on a determination result of the determination circuit.

2. A signal processing device comprising:
- a receiver that receives a signal;
- a transmitter that transmits the signal received by the receiver; and
- a controller, wherein
- the receiver includes an equalizer circuit that compensates attenuation of the signal received,
- the transmitter includes a noise cancelling circuit that reduces noise included in a processed signal generated in the receiver,
- the controller:
  - detects a threshold voltage of a transistor included in the signal processing device;

when the threshold voltage detected is lower than or equal to a predetermined voltage value, sets a current of the equalizer circuit to be lower than or equal to a predetermined current value and deactivates the noise cancelling circuit; and when the threshold voltage detected is higher than the predetermined voltage value, sets the current of the equalizer circuit to be higher than the predetermined current value and activates the noise cancelling circuit, and the controller includes:

a detection circuit that detects the threshold voltage of the transistor included in the signal processing device; and a memory circuit, whether the threshold voltage detected is lower than or equal to the predetermined voltage value is determined by an external tester outside the signal processing device, and the external tester writes, into the memory circuit, data indicating a determination result of the external tester.

3. The signal processing device according to claim 2, wherein the controller controls the equalizer circuit and the noise cancelling circuit based on the data written into the memory circuit.

4. The signal processing device according to claim 1, wherein the detection circuit includes:

a resistor that is switchable to a pull-up resistor or a pull-down resistor;

a first current source that is connected between the resistor and a power source and includes a p-channel MOSFET; and a second current source that is connected between the resistor and a ground and includes an n-channel MOSFET, and the detection circuit:

detects, as the threshold voltage of the transistor included in the signal processing device, a threshold voltage of the p-channel MOSFET and a threshold voltage of the n-channel MOSFET;

detects the threshold voltage of the p-channel MOSFET by turning on the first current source and turning off the second current source to switch the resistor to the pull-down resistor; and detects the threshold voltage of the n-channel MOSFET by turning off the first current source and turning on the second current source to switch the resistor to the pull-up resistor.

5. The signal processing device according to claim 4, wherein the resistor is a variable resistor.

6. The signal processing device according to claim 1, wherein the predetermined voltage value is a value corresponding to a jitter tolerance determined according to a standard.

7. A method of controlling a signal processing device that includes:

a receiver that receives a signal; and a transmitter that transmits the signal received by the receiver, the receiver including an equalizer circuit that compensates attenuation of the signal received, the transmitter including a noise cancelling circuit that reduces noise included in a processed signal generated in the receiver, the method comprising:

detecting a threshold voltage of a transistor included in the signal processing device;

determining whether the threshold voltage detected is lower than or equal to a predetermined voltage value;

when the threshold voltage of the transistor included in the signal processing device is determined to be lower than or equal to the predetermined voltage value, setting a current of the equalizer circuit to be lower than or equal to a predetermined current value by controlling the equalizer circuit and deactivating the noise cancelling circuit by controlling the noise cancelling circuit; and when the threshold voltage of the transistor included in the signal processing device is determined to be higher than the predetermined voltage value, setting the current of the equalizer circuit to be higher than the predetermined current value by controlling the equalizer circuit and activating the noise cancelling circuit by controlling the noise cancelling circuit.

8. A method of controlling a signal processing device that includes:

a receiver that receives a signal;

a transmitter that transmits the signal received by the receiver; and a memory circuit, the receiver including an equalizer circuit that compensates attenuation of the signal received, the transmitter including a noise cancelling circuit that reduces noise included in a processed signal generated in the receiver, the method comprising:

detecting a threshold voltage of a transistor included in the signal processing device;

determining, by an external tester outside the signal processing device, whether the threshold voltage detected is lower than or equal to a predetermined voltage value;

when the external tester determines that the threshold voltage of the transistor included in the signal processing device is lower than or equal to the predetermined voltage value, setting a current of the equalizer circuit to be lower than or equal to a predetermined current value by writing, into the memory circuit, data indicating a determination result of the external tester, and deactivating the noise cancelling circuit; and when the external tester determines that the threshold voltage of the transistor included in the signal processing device is higher than the predetermined voltage value, setting the current of the equalizer circuit to be higher than the predetermined current value by writing, into the memory circuit, data indicating a determination result of the external tester, and activating the noise cancelling circuit.

* * * * *